United States Patent [19]
Odagawa

[11] Patent Number: 5,412,675
[45] Date of Patent: May 2, 1995

[54] SEMICONDUCTOR OPTICAL SOURCE CAPABLE OF COMPENSATING FOR TEMPERATURE-INDUCED VARIATION OF LASER OSCILLATION THRESHOLD

[75] Inventor: Tetsufumi Odagawa, Kawasaki, Japan

[73] Assignee: Fujitsu Limited, Kanagawa, Japan

[21] Appl. No.: 90,159

[22] PCT Filed: Dec. 25, 1992

[86] PCT No.: PCT/JP92/01702
§ 371 Date: Jul. 28, 1993
§ 102(e) Date: Jul. 28, 1993

[87] PCT Pub. No.: WO93/13576
PCT Pub. Date: Jul. 8, 1993

[30] Foreign Application Priority Data
Dec. 26, 1991 [JP] Japan .................... 3-344552

[51] Int. Cl.[6] .............................. H01S 3/133
[52] U.S. Cl. ............................ 372/29; 372/50; 372/31; 372/33; 359/187
[58] Field of Search ............. 372/26, 31, 33, 38, 372/50; 359/187

[56] References Cited

U.S. PATENT DOCUMENTS

| | | | |
|---|---|---|---|
| 4,680,810 | 7/1987 | Swartz | 455/609 |
| 4,698,817 | 10/1987 | Purley | 372/38 |
| 4,911,765 | 3/1990 | Song et al. | 372/50 |
| 4,945,541 | 7/1990 | Nakayama | 372/38 |
| 5,018,154 | 5/1991 | Ohashi | 372/38 |
| 5,287,375 | 2/1994 | Fujimoto | 372/38 |
| 5,309,269 | 5/1994 | Shibao | 359/187 |
| 5,334,826 | 8/1994 | Sato et al. | 372/31 |
| 5,337,323 | 8/1994 | Rokugawa et al. | 572/31 |

OTHER PUBLICATIONS

Patent Abstracts of Japan, vol. 6, No. 72 (E–105), May 7, 1982, & JP,A,57 013 790.
Patent Abstracts of Japan, vol. 12, No. 108 (E–597), Apr. 7, 1988, & JP,A,62 237 785.
Patent Abstracts of Japan, vol. 15, No. 304 (E–1096), Aug. 5, 1991, & JP,A,03 109 787.
Patent Abstracts of Japan, vol. 11, No. 363 (E–560), Nov. 26, 1987, & JP,A,62 136 932.
Patent Abstracts of Japan, vol. 9, No. 310 (E–364), Dec. 6, 1985, & JP,A,60 145 680.
Patent Abstracts of Japan, vol. 9, No. 136 (E–320), Jun. 12, 1985, & JP,A,60 018 982.
"Determination of Diode Parameters and Threshold Current from I-V Measurements of InGaAsP/InP DFB DH Lasers", Kanack et al., Second International Conference on Indium Phosphide and Related Materials, Apr. 23-25, 1990, pp. 255-259.

*Primary Examiner*—Rodney B. Bovernick
*Assistant Examiner*—Robert McNutt
*Attorney, Agent, or Firm*—Nikaido, Marmelstein, Murray & Oram

[57] ABSTRACT

A semiconductor optical source includes a first laser diode supplied with a signal current pulse and a first bias current for producing an output optical signal pulse in response to the signal current pulse, a first biasing circuit for supplying the first bias current to the first laser diode, a second laser diode supplied with a second bias current for producing an output optical beam in response thereto, a second biasing circuit for supplying the second bias current to the first laser diode; a heat sink for maintaining the first laser diode and the second laser diode at a substantially identical temperature; and a threshold detection circuit for detecting a threshold of laser oscillation of the second laser diode, wherein the threshold detection circuit controls the first biasing circuit such that the first bias current is maintained at a level that is related to the threshold of the second laser diode.

6 Claims, 6 Drawing Sheets

SEMICONDUCTOR OPTICAL SOURCE CAPABLE OF COMPENSATING FOR TEMPERATURE-INDUCED VARIATION OF LASER OSCILLATION THRESHOLD

TECHNICAL FIELD

The present invention generally relates to semiconductor optical devices, and more particularly to a semiconductor optical source that uses a laser diode wherein the temperature-induced variation of laser characteristics is compensated.

BACKGROUND ART

Laser diodes are used extensively in the human society particularly in the field of optical telecommunication and optical storage of information. Further, various application of laser diodes are studied for example in the field of optical information processing such as optical computers.

In laser diodes, it is well known that the operational characteristics, particularly the threshold of laser oscillation, change with environmental temperature. Thus, in order to compensate for such a temperature-induced variation of the operational characteristics, the laser diode used for long range telecommunication purposes such as the devices used for optical submarine cables, use a temperature regulation system such that the laser diode is held at a constant temperature.

On the other hand, there exists other applications of laser diode wherein use of such a temperature regulation system is not possible or preferable. For example, the laser diodes used in the optical wiring of supercomputers have to be accommodated in a very limited space and the room for the temperature regulator is generally not available. Similarly, temperature regulation is not practical for the laser diodes that are used for the local area network (LAN), laser printers, and the like, because of the increased cost.

In order to avoid the unwanted temperature-induced fluctuation in the operation of laser diodes, conventional semiconductor optical sources use a feedback control of optical beam called automatic power control (APC) wherein the bias current is controlled such that the power of the output optical pulse of the laser diode is held constant. On the other hand, such an APC control has a problem in that, associated with the temperature-induced variation of the threshold of laser oscillation, the extinction ratio of the laser diode is deteriorated with increasing temperature.

FIG. 1 shows the conventional APC control applied to laser diodes, wherein the horizontal axis represents the drive current while the vertical axis represents the corresponding output optical power. Further, the line designated as $P_L$ represents the output characteristics of the laser diode at a low temperature, while the line designated as $P_H$ represents the output characteristics of the same laser diode at a high temperature.

Referring to FIG. 1, the drive current is supplied to the laser diode in the form of a current pulse $i_d$, wherein the current pulse $i_d$ is biased to a threshold level $i_{thL}$ that represents the threshold level of the laser diode at the low temperature, such that the laser oscillation occurs with a minimum, threshold power level when no current pulse $i_d$ is supplied. Further, the magnitude of the current pulse $i_d$ is set such that a predetermined output power is achieved in response to the drive current pulse $i_d$ at the foregoing low temperature. In the illustrated example, the magnitude of the current pulse $i_d$ is set to 5 mA.

In the APC control, the biasing of the current pulse $i_d$ is subjected to a feedback control that is achieved in response to the output power of the laser diode, such that a predetermined output power such as 0.5 mW is secured even when the temperature of the laser diode changes. More specifically, the bias current added to the current pulse $i_d$ is changed such that the laser diode produces the foregoing predetermined output power in response to the current pulse $i_d$.

When the biasing of the drive current pulse $i_d$ is set as such, there occurs a problem, when the temperature rises, in that the laser diode produces the optical output with a substantial power even when the current pulse $i_d$ is not supplied. In the illustrated example, the current pulse $i_d$ is biased at the level of 20 mA in the illustrated example, and the laser diode produces the output optical power of about 0.25 mW in the absence of the input current pulse $i_d$. Thereby, the extinction ratio of the output optical beam is inevitably deteriorated. Associated with the degradation of the extinction ratio, discrimination of the data "0" and the data "1" at the reception side of the optical communication path becomes difficult.

In order to maintain the output power of the optical beam constant irrespective of variation of the temperature, it is also possible to change the magnitude of the drive current pulse in response to the variation of temperature. For example, one may fix the level of the bias current at $i_{thl}$ and increase the magnitude of the current pulse $i_d$ with temperature such that the output power of 0.5 mW is secured even when the temperature increases. According to this approach, one can maintain a large extinction ratio. However, the foregoing approach has a drawback in that there tends to occur a delay in the timing of the optical pulse in correspondence to the interval necessary for the carrier density in the active layer of the laser diode to increase to a sufficient level in response to the increase of the drive current from the level $i_{thl}$ to the desired level such as 25 mA. In other words, there occurs a time lag in the optical pulse with respect to the timing of the drive current pulse.

DISCLOSURE OF THE INVENTION

Accordingly, it is a general object of the present invention to provide a novel and useful semiconductor optical source wherein the foregoing problems are eliminated.

Another and more specific object of the present invention is to provide a semiconductor optical source that uses a laser diode wherein the temperature-induced variation of laser characteristics is compensated for while without sacrificing the extinction ratio.

Another object of the present invention is to provide a semiconductor optical source, comprising: a first laser diode supplied with a signal current pulse and a first bias current for producing an output optical signal pulse in response said signal current pulse; first biasing means for supplying said first bias current to said first laser diode; a second laser diode supplied with a second bias current for producing an output optical beam in response thereto; second biasing means for supplying said second bias current to said first laser diode; heat sink means for maintaining said first laser diode and said second laser diode at a substantially identical temperature; and threshold detection means for detecting a threshold of laser oscillation of said second laser diode, said threshold detection means controlling said first biasing means such that said first bias current is maintained at a level that is related to said threshold of said second laser diode. According to the present invention, one can maintain the bias current of the laser diode used for optical communication, at a level corresponding to the threshold level even when the temperature of the laser diode changes. Thereby, the extinction ratio of the optical pulse is held maximum without using the temperature regulation device, and the cost as well as the size of the semiconductor optical source is minimized.

Other objects and further features of the present invention will become apparent from the following detailed description when read in conjunction with the attached drawings.

BEST MODE FOR CARRYING OUT THE INVENTION

Figure 2:
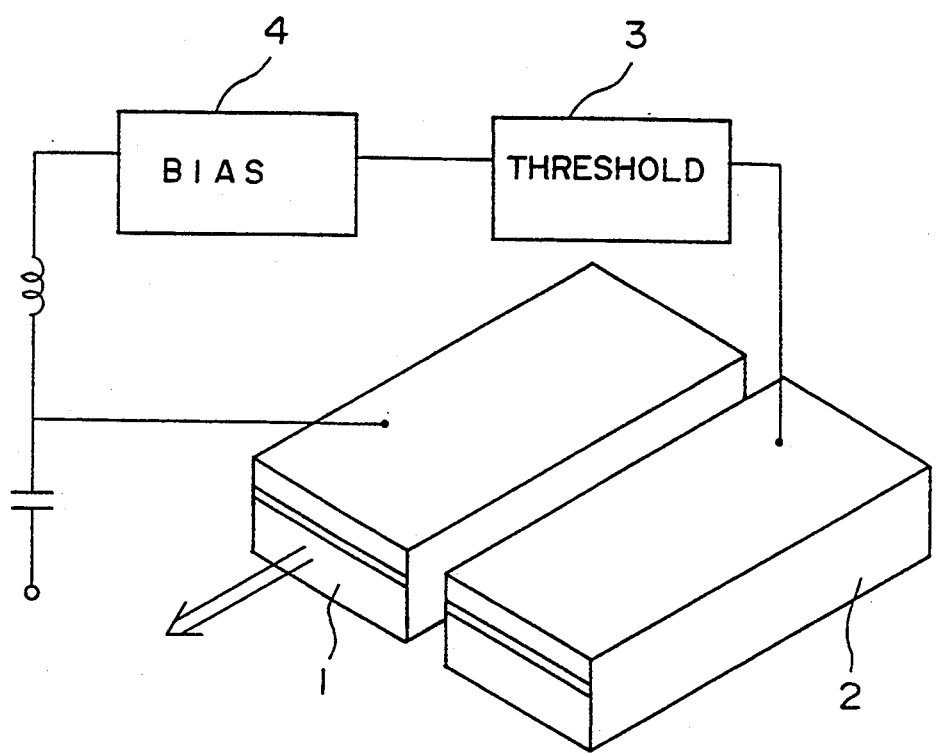
FIG. 2 is a diagram showing the principle of the present invention.

First, the principle of the present invention will be described with reference to FIG. 2 showing an essential part of a semiconductor optical source that includes a laser diode 1 of which bias current is subjected to a feedback control process.

Referring to FIG. 2, it will be noted that another laser diode 2, having a temperature characteristic substantially identical with the temperature characteristic of the laser diode 1, is provided adjacent to the laser diode 1 such that the temperature of the laser diode 1 and the temperature of the laser diode 2 are held substantially at the same temperature, and a threshold detection circuit 3 is provided for detecting the threshold level of the laser diode 2. Further, the semiconductor optical source of FIG. 2 includes a biasing circuit 4 for supplying a bias current to the laser diode 1, wherein the biasing circuit 4 is supplied with a control signal indicative of the threshold bias current of the laser diode 2 from the threshold detection circuit 3 and sets the magnitude of the bias current that is supplied to the laser diode 1 at a level corresponding to the threshold level of the laser diode 2. Further, an input electrical signal is superposed on the bias current thus supplied from the biasing circuit 4 to the laser diode via a capacitor as illustrated.

According to the present invention, one can set the biasing level of the laser diode 1 close to the threshold level of the laser diode 1, even when the operational temperature of the semiconductor optical source changes with environmental temperature. Thereby, one can maximize the extinction ratio of the optical signal produced by the laser diode 1.

Next, a first embodiment of the present invention will be described with reference to FIG. 3, wherein shows the operational characteristics of a laser diode of the present embodiment at a low temperature (designated as $P_L$) and at a high temperature (designated as $P_H$).

Figure 3:
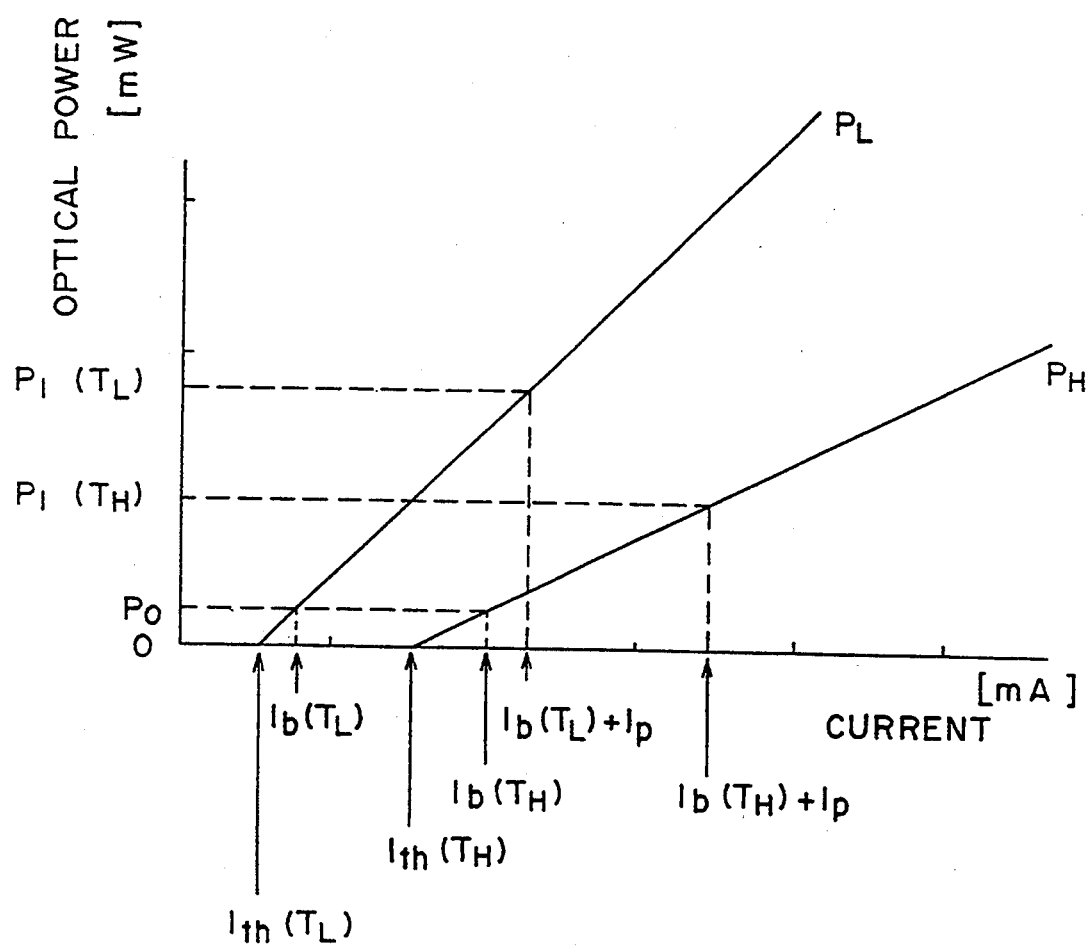
FIG. 3 is a diagram showing the operation of the semiconductor optical source according to a first embodiment of the present invention.

Referring to FIG. 3, the vertical axis represents the output optical power of the laser diode and the horizontal axis represents the drive current supplied to the laser diode, similarly to the characteristic diagram of FIG. 3. In FIG. 3, the threshold level of the drive current at the low temperature is designated by $I_{th}(T_L)$, while the threshold level at the high temperature is designated by $I_{th}(T_H)$.

In the present invention, the level of the bias current is controlled close to the threshold level irrespective of the temperature of the device such that the laser diode produces a constant optical power $P_0$ even when the temperature changes. In order to achieve the foregoing control of the drive current in response to the temperature, the present invention controls the drive current to the level $I_b(T_L)$ that is close to the threshold level when the optical source operates at the low temperature, while at the high temperature, the drive current is set at the level $I_b(T_H)$ that is also close to the threshold level. Thereby, the output optical power of $P_0$ that is outputted from the laser diode in the absence of the input signal pulse, is maintained constant at a level close to zero, irrespective of the temperature.

When a drive current pulse is supplied, on the other hand, the drive current increases by $I_p$ that represents the magnitude of the current pulse. Thus, at the low temperature, the laser diode produces an optical output pulse having a magnitude $P_1(T_L)$ in response to a drive current that is given as a sum of the bias current $I_b(T_L)$ and the signal current pulse $I_p$ ($P_1(T_L)=I_b+I_p$), while at the high temperature, the laser diode produces an optical output pulse having a magnitude $P_1(T_H)$ in response to a drive current that is given as a sum of the bias current $I_b(T_H)$ and the signal current pulse $I_p(P_1(T_H)=I_b+I_p)$.

Figure 1:
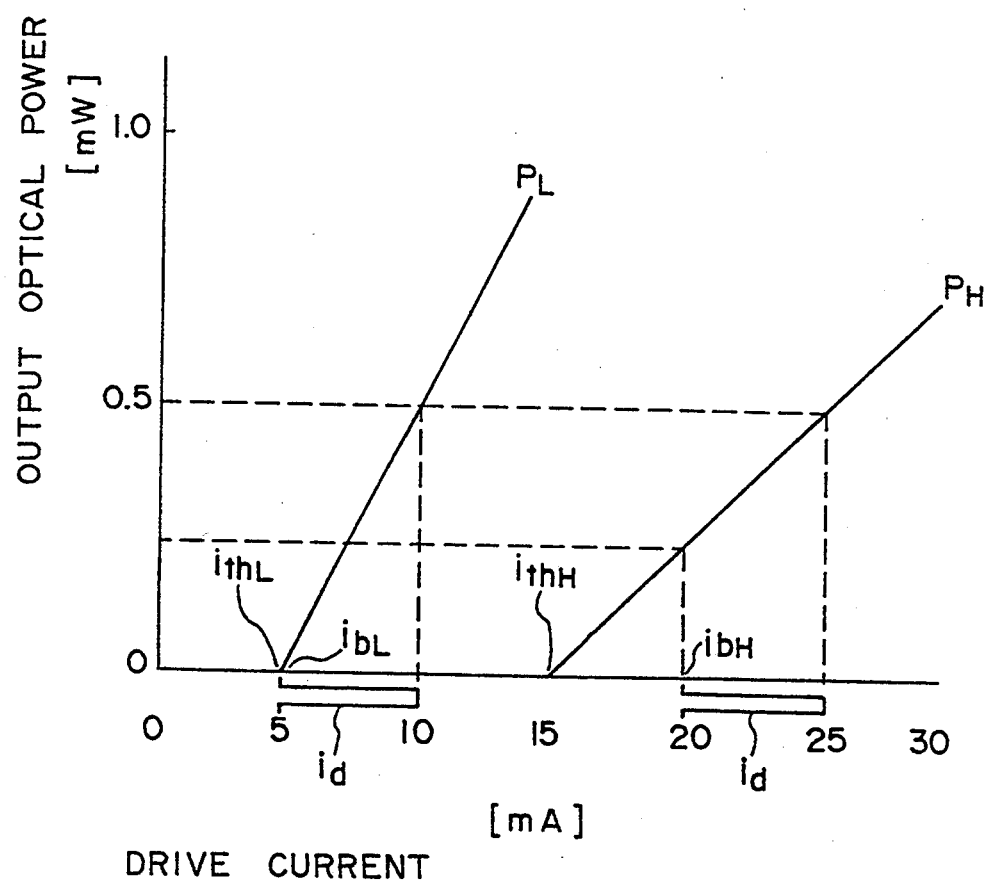
FIG. 1 is a diagram showing the operational characteristics of a conventional semiconductor optical source.

According to the present invention, it will be noted that the output optical power $P_0$ is held close to zero irrespective of the operational temperature of the laser diode, and a large extinction ratio X is guaranteed as compared with the conventional device of which operational characteristic is represented in FIG. 1, wherein the extinction ratio X is defined as $X=1+I_p/(I_b(T_H)-I_{th}(T_H))$.

Figure 4:
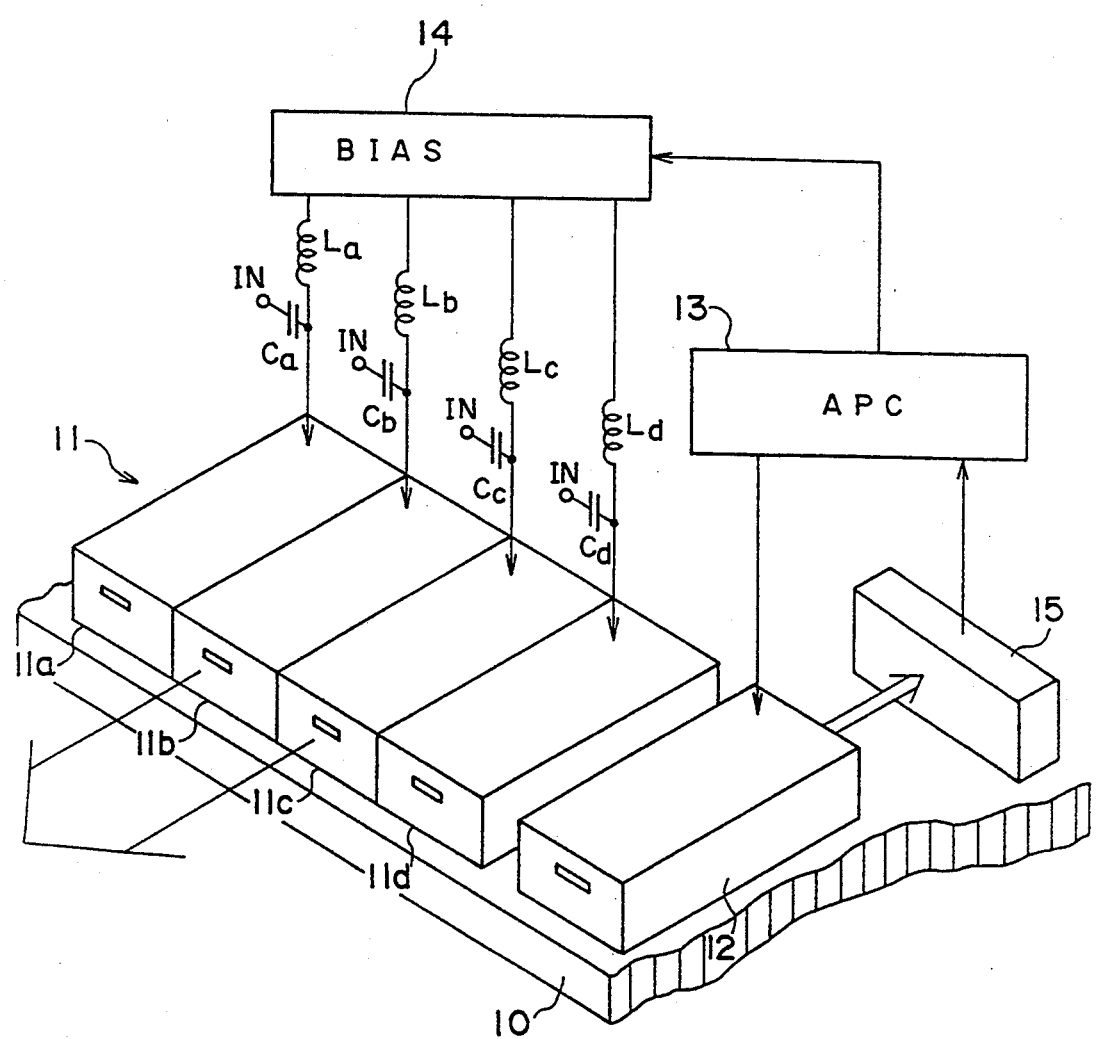
FIG. 4 is a diagram showing the semiconductor optical source according to the first embodiment of the present invention.

FIG. 4 shows the construction of the semiconductor optical source according to the first embodiment of the present invention.

Referring to FIG. 4, the device includes a laser diode array 11 including a number of laser diodes 11a–11d arranged for producing multiple-bit optical pulse signals, wherein there is provided another, additional laser diode 12 for detecting the threshold of laser oscillation. There, each laser diode included in the laser diode array 11 has a structure identical with each other and is driven by a drive circuit 14 as usual, while the laser diode 12 has a structure identical with the structure of the laser diodes 11a–11d and is carried on a common substrate 10 that acts also as a heat sink. Thereby, the laser diode 12 is held at a temperature substantially identical with the temperature of the laser diodes 11a–11d forming the laser diode array 11.

More specifically, the semiconductor optical source of FIG. 4 includes a drive circuit 13 for driving the laser diode 12 and a photodetector 15 that is disposed on the same substrate 10 to detect the optical beam produced by the laser diode 12. In the illustrated example, the drive circuit 13 controls the laser diode 12 in response to the output voltage of the photodetector 15 such that the output power of the laser diode 12 is maintained at the level $P_0$ that may be set at 0.17 mW, for example. The drive circuit 13 thereby controls a drive circuit 14 of the laser diode array 11 such that each of the laser diodes 11a–11d is biased at the bias level identical with the bias level of the laser diode 12.

As illustrated in FIG. 4, the drive circuit 14 supplies the drive current to the laser diodes 11a–11d via inductances $L_a$–$L_d$ respectively, and the input signal pulse is added thereto via respective capacitors $C_a$–$C_d$. Thereby, one can secure a large extinction ratio in the optical pulse signal outputted from the laser diode array 11 as explained with reference to FIG. 3. In a typical example where the laser diode has the threshold current level $I_{th}(T_H)$ of 15 mA at 25° C. and the drive current pulse $I_p$ is given with a magnitude of 30 mA, one can secure an extinction ratio of more than 10 dB at 80° C. by setting the bias current $I_b(T_H)$ at 18.3 mA.

In the construction of the present embodiment, the optical power $P_0$ is set at the largest level that is possible so that a reliable APC control is achieved based upon the power $P_0$. There, the upper boundary of the optical power $P_0$ is determined based upon the constraint that a satisfactory extinction ratio X is obtained at the highest temperature that is expected in the operational environment of the semiconductor optical source.

Figure 6A:
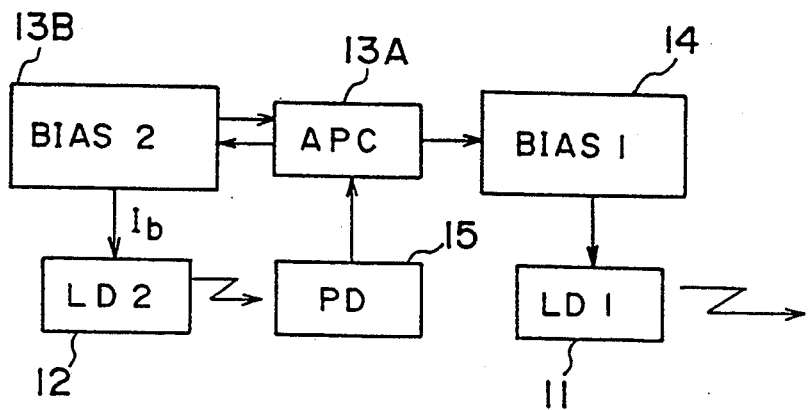
FIGS. 6(A)–6(C) are block diagrams showing the more detailed construction of the semiconductor optical source according to the first through third embodiments of the present invention.

FIG. 6(A) shows a more detailed diagram of the construction of the semiconductor optical source according to the first embodiment.

Referring to FIG. 6(A), it will be noted that the drive circuit 13 includes an APC unit 13A that is supplied with the output of the photodetector 15 and a driver unit 13B that drives the laser diode 12 under control of the APC unit 13B. More specifically, the APC unit 13A detects the output level of the photodetector 15 and controls the driver unit 13B such that the bias current supplied to the laser diode 12 is reduced when the output optical power of the laser diode 12 exceeds the predetermined threshold $P_0$ that is set close to zero as already mentioned. On the other hand, when the output of the laser diode 12 is smaller than the foregoing threshold $P_0$, the APC unit 13A controls the driver unit 13B to increase the bias current. Thereby, the APC unit 13A achieves a feedback control of the optical power of the laser diode 12.

In addition, the APC unit 13A is supplied with a signal indicative of the bias current supplied to the laser diode 12 and controls the drive circuit 14 such that the circuit 14 supplies the bias current to the laser diodes in the laser diode array 11 with a magnitude that is identical with the bias current supplied to the laser diode 12. Thereby, the laser diodes 11a–11d forming the laser diode array 11 are all biased at the level $P_0$ irrespective of the temperature of the device. It should be noted that the laser diode 12 is carried on the same substrate 10 of the laser diode array 11 and the temperature of the device 12 is held substantially identical with the temperature of the laser diode array 11 as already mentioned.

Figure 6B:
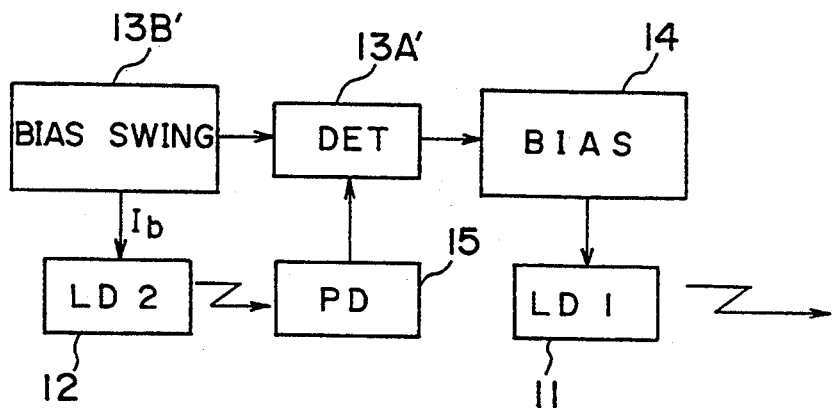

Next, a second embodiment of the present invention will be described with reference to FIG. 6(B), wherein the semiconductor optical source has a construction similar to the device of FIG. 6(A) and includes the laser diode array 11 and the laser diode 12 similarly to the first embodiment. In the present embodiment, it will be noted that the output of the photodetector 15 is supplied to a threshold-level detection unit 13A' for detection of the threshold level of laser oscillation of the laser diode 12 while changing the bias current to the laser diode 12 up and down by a bias swing unit 13B', wherein the bias swing unit 13B' increases and decreased the bias current repeatedly in a range extending from zero to a predetermined upper limit that is selected sufficiently larger than the threshold level $I_b(T_H)$.

More specifically, the detection unit 13A' monitors the optical output of the laser diode 12 while the drive current supplied thereto is changed up and down and detects a sudden change in the output optical power of the laser diode 12. For example, the output optical power of the laser diode 12 increases suddenly when the bias current exceeds the threshold level in correspondence to the commencement of laser oscillation. Further, the unit 13A' produces the trigger signal when the bias current has decreased below the threshold level. In response to the detection of such a sudden change in the optical output of the laser diode 12, the unit 13A' controls the drive circuit 14 such that the laser diodes in the laser diode array 11 are biased at the level identical with the threshold level of the laser diode 2. In other words, the laser diodes 11a–11d in the laser diode array 11 are all biased to the threshold level of laser oscillation even when the temperature has changed. It should be noted that the unit 13A' of FIG. 6(B) is supplied with a signal indicative of the magnitude of the bias current that is supplied to the laser diode 12, from the bias swing unit 13B', and latches the same in response to the detection of the foregoing sudden change of the optical output of the laser diode 12. The detected bias current is updated each time the sudden change of the optical output is detected.

Next, a third embodiment of the present invention will be described with reference to FIG. 5.

Figure 5:
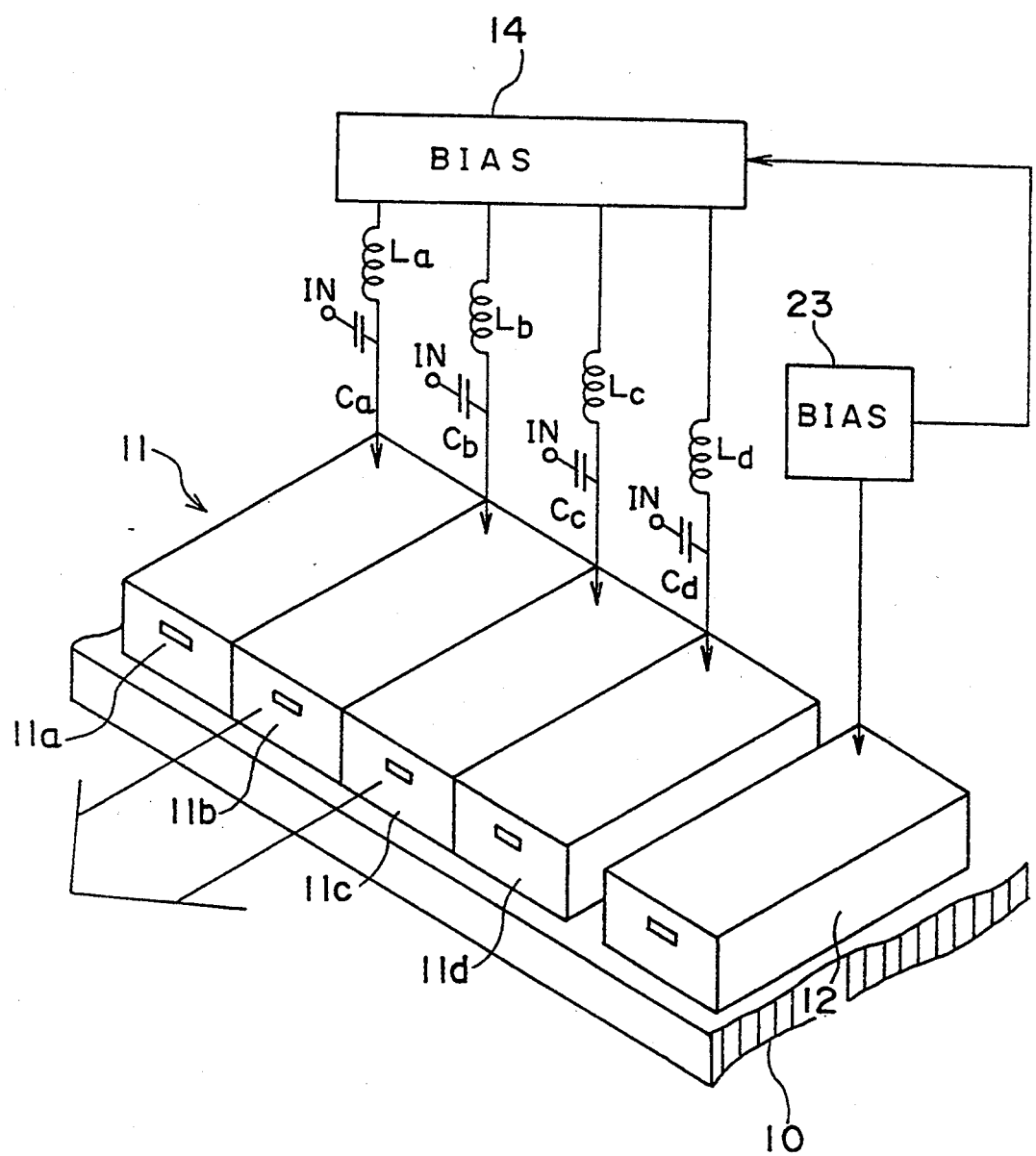
FIG. 5 is a diagram showing the semiconductor optical source according to second and third embodiments of the present invention.

Referring to FIG. 5, it will be noted that the photodetector 15 used in the first and second embodiments is eliminated and a bias circuit 23 is used for biasing the laser diode 12 in place of the unit 13. There, the bias circuit 23 detects the drive current supplied to the laser diode 12 together with the drive voltage and detects the sudden change of the drive current with respect to the voltage. Further, the circuit 23 latches the bias current corresponding to such a sudden change and supplies a control signal indicative of the magnitude of the bias current to the drive circuit 14. The drive circuit 14 in turn controls the bias current supplied to the laser diodes 11a–11d in the laser diode array 11 at the level indicated by the control signal provided by the bias circuit 23, and the laser diodes in the array 11 are all biased close to the threshold level of laser oscillation. Similarly to the second embodiment, the latched value representing the magnitude of the bias current is updated each time the sudden change of the drive current is detected.

Figure 6C:
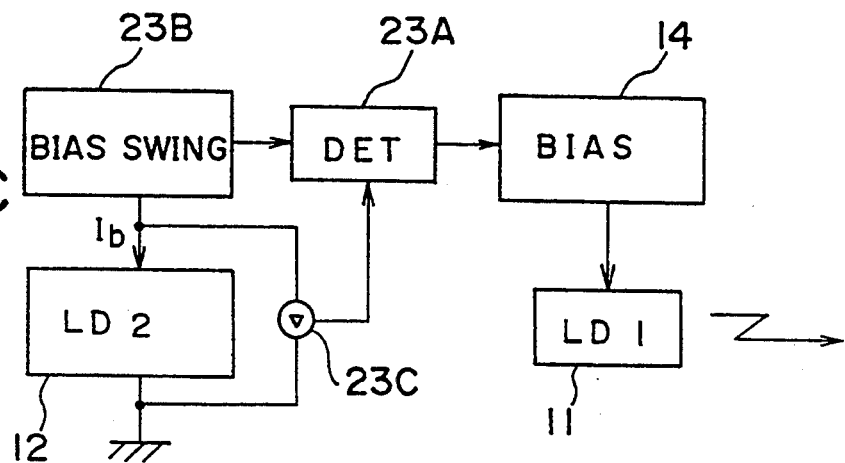

FIG. 6(C) shows the block diagram of the laser diode of the present embodiment.

Referring to FIG. 6(C), the bias circuit 23 includes a voltage detection unit 23C for detecting the voltage that is applied to the laser diode 12, and a bias swing circuit 23B similar to the circuit 13B' changes the bias current up and down repeatedly. Further, a threshold detection unit 23A is supplied with a signal indicative of the magnitude of the detected drive current and voltage respectively from the units 23B and 23C and detects the sudden change in the drive current. The unit 23A further latches the magnitude of the drive current and supplies a control signal indicative of the latched drive current to the bias circuit 14. The bias circuit 14 thereby supplies the bias current to the laser diodes forming the laser diode array 11.

According to the present embodiment, the threshold is detected with high precision based upon the differential voltage versus current characteristic curve of the laser diode, and one can maintain the bias level of the laser diodes closer to the threshold of laser oscillation.

In the foregoing embodiments, it is assumed that the laser diodes 11a–11d forming the array 11 and the laser diode 12 are held at the same temperature. However, this requirement is not mandatory in the present invention and the temperature of the laser diode 12 may be different from the temperature of the laser diode array 11, provided that both temperatures are related with each other according to a known relationship. Further, the structure of the laser diode 12 is not necessarily be exactly identical with the laser diodes forming the array 11. Furthermore, one may use one of the laser diodes forming the laser diode array 11 for the laser diode 12.

Further, the present invention is not limited to the embodiments described heretofore, but various variations and modifications may be made without departing from the scope of the invention.

Industrial Applicability

According to the present invention, one can maintain a satisfactory extinction ratio in the output optical signal of laser diodes even when temperature regulation of the laser diodes is omitted. Thus, the semiconductor optical source of the present invention is useful particularly in the applications such as optical wiring of supercomputers or local area network wherein the room for the temperature regulation device is not available or the increase of cost associated with the temperature regulation is not desirable.

I claim:

1. A semiconductor optical source, comprising:
   a first laser diode supplied with a signal current pulse and a first bias current for producing an output optical signal pulse in response to said signal current pulse;
   first biasing means for supplying said first bias current to said first laser diode;
   a second laser diode supplied with a second bias current for producing an output optical beam in response thereto;
   second biasing means for supplying said second bias current to said second laser diode;
   heat sink means for maintaining said first laser diode and said second laser diode at a substantially identical temperature; and
   control means for controlling said first biasing means such that said first bias current is maintained at a level that is related to a threshold of said second laser diode wherein said control means controls said second biasing means in response to an optical power of said optical beam produced by said second laser diode by causing said second biasing means to supply said second bias current to said second laser diode such that said optical power of said optical beam is maintained at a predetermined level, said control means further controlling said first biasing means such that said first biasing means supplies said first bias current with a level substantially identical with said second bias current to said first laser diode, said predetermined level of said optical power being determined such that an extinction ratio of said optical signal pulse that is produced by said first laser diode exceeds a desired value at a highest expected operational environment temperature of said semiconductor optical source.

2. A semiconductor optical source as claimed in claim 1, wherein said control means includes a photodetector disposed on said heat sink means for receiving said optical beam produced by said second laser diode.

3. A semiconductor optical source as claimed in claim 1, wherein said semiconductor optical source includes a plurality of laser diodes provided on said heat sink means and forming an array, said first laser diode and said second laser diode being included in said array.

4. A semiconductor optical source as claimed in claim 3, wherein said semiconductor optical source includes a plurality of laser diodes provided in said heat sink means in a form of an array as said first laser diode.

5. A method for controlling a semiconductor optical source, comprising the steps of:
   maintaining a first laser diode and a second laser diode at a substantially identical temperature;
   maintaining a second bias current supplied to said second laser diode at a predetermined level;
   maintaining a first bias current supplied to said first laser diode at a level substantially identical with said predetermined level of said second bias current; and
   supplying a current pulse signal to said first laser diode in addition to said first bias current to produce an optical pulse signal in correspondence to said current pulse signal wherein said predetermined level of said second bias current being set such that said second laser diode produces an output optical beam with a predetermined magnitude set such that said first laser diode produces said optical pulse signal with an extinction ratio that exceeds a desired value at a highest expected environment temperature in which the semiconductor optical source is operated.

6. A method as claimed in claim 5, wherein said predetermined level of said second bias current is set in correspondence to a sudden increase of optical power of an optical beam produced by said second laser diode.

* * * * *